United States Patent [19]

Englund, Jr. et al.

[11] 4,363,004

[45] Dec. 7, 1982

[54] COMBINING AND FILTER CIRCUIT FOR A PHASE LOCKED LOOP

[75] Inventors: Arvid E. Englund, Jr., Lynchburg; Gregory N. Mears, Forest, both of Va.

[73] Assignee: General Electric Company, Lynchburg, Va.

[21] Appl. No.: 198,831

[22] Filed: Oct. 20, 1980

[51] Int. Cl.³ .............................................. H03L 7/08
[52] U.S. Cl. ...................................... 331/8; 307/521; 330/303; 331/17; 333/171
[58] Field of Search ...................... 331/4, 8, 17, 18, 25; 328/155, 167; 333/172, 170, 171; 455/260; 375/120; 329/122; 307/520, 521; 330/303

[56] References Cited

U.S. PATENT DOCUMENTS

| | | | |
|---|---|---|---|
| 3,316,497 | 4/1967 | Brooks | 331/17 |
| 3,745,376 | 7/1973 | McIntosh | 307/520 |
| 3,993,958 | 11/1976 | Cutsogeorge | 331/17 X |
| 4,131,862 | 12/1978 | Black et al. | 331/4 |

*Primary Examiner*—Siegfried H. Grimm
*Attorney, Agent, or Firm*—James J. Williams

[57] ABSTRACT

A combining and filter circuit is provided to connect the acquisition circuit and phase detector circuit to the voltage controlled oscillator in a phase locked loop. The combining and filter circuit includes twin-T filters for removing reference frequency signals. An output circuit includes series resistors and capacitors, and reverse poled Schottky diodes which provide rapidly changing acquisition signals that are relatively noise free.

14 Claims, 2 Drawing Figures

COMBINING AND FILTER CIRCUIT FOR A PHASE LOCKED LOOP

BACKGROUND OF THE INVENTION

Our invention relates to a combining and filter circuit for a phase locked loop, and particularly to such a circuit that combines phase detector and acquisition circuit signals, and filters those signals for application to a voltage controlled oscillator in a phase locked loop.

Phase locked loops using a reference oscillator and a voltage controlled oscillator usually include an acquisition circuit to provide signals that bring the voltage controlled oscillator frequency within the range of the phase detector circuit. After the voltage controlled oscillator frequency is within the range of the phase detector circuit, signals from the phase detector circuit can then control the frequency of the voltage controlled oscillator. Where an acquisition circuit is used in addition to a phase detector circuit, it is necessary to provide an arrangement that applies the signals from the two circuits to the voltage controlled oscillator.

Accordingly, a primary object of our invention is to provide a new and improved circuit that combines signals from an acquisition circuit and from a phase detector circuit for application to a voltage controlled oscillator in a phase locked loop.

A general object of our invention is to provide a new and improved signal combining circuit for use in a phase locked loop.

In phase locked loops, filtering is needed or desired to attenuate the reference frequency signals so that the voltage controlled oscillator does not produce spurs indicative of those reference frequencies. Low pass filtering is also needed or desired to provide relatively stable control signals for the voltage controlled oscillator.

Accordingly, another object of our invention is to provide a new and improved filter circuit for use in a phase locked loop.

A relatively specific object of our invention is to provide a new and improved filter circuit that attenuates the reference frequency signals in a phase locked loop, and that provides low pass filtering of signals applied to a voltage controlled oscillator.

Another object of our invention is to provide a new and improved circuit that combines signals from an acquisition circuit and from a phase detector circuit, and that filters these signals for application to a voltage controlled oscillator in a phase locked loop.

Another object of our invention is to provide a new and improved signal combining circuit that attenuates reference frequency signals and provides low pass filtering of the combined signals for application to the voltage controlled oscillator in a phase locked loop.

SUMMARY OF THE INVENTION

Briefly, these and other objects are achieved in accordance with our invention by a circuit having respective inputs for phase detector signals and acquisition circuit signals in a phase locked loop. The signals are combined and filtered for rejecting the reference frequencies. The filtered signals are applied through reverse poled diodes to output capacitors, one of which filters noise signals and one of which is charged and discharged through reverse poled diodes. The circuit thus combines the acquisition and phase detector signals, filters these signals, and provides a single output signal for application to a voltage controlled oscillator.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

DESCRIPTION OF THE PREFERRED EMBODIMENT

Figure 1:
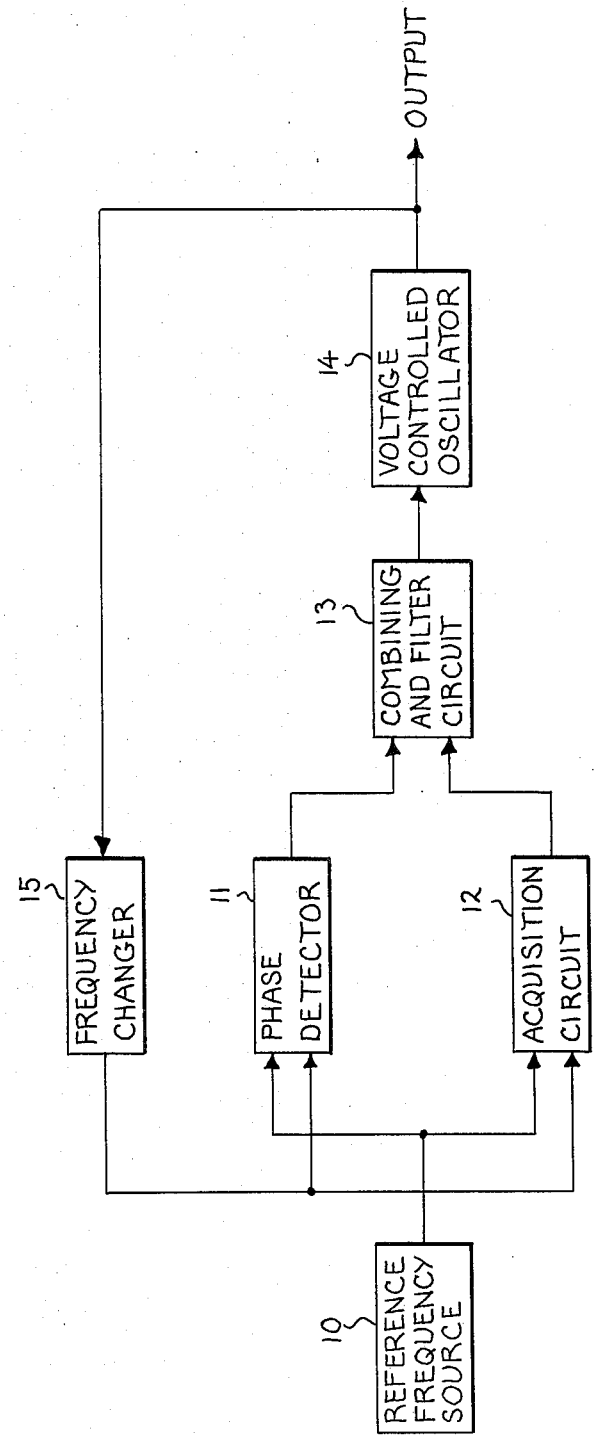
FIG. 1 shows a block diagram of a phase locked loop in which our circuit can be used.

The phase locked loop of FIG. 1 is shown connected as a frequency synthesizer. However, persons skilled in the art will appreciate that the phase locked loop can be used for other purposes. In the phase locked loop of FIG. 1, a reference frequency source 10, typically a stable crystal controlled oscillator, whose frequency is divided down, has its output signals applied to respective first inputs of a phase detector 11 and to an acquisition circuit 12. The outputs from the phase detector 11 and acquisition circuit 12 are applied to a combining and filter circuit 13 which will be explained in connection with FIG. 2. The circuit 13 combines and filters the two signals from the phase detector 11 and acquisition circuit 12, and produces a single signal which is applied to a voltage controlled oscillator 14 to control the frequency of that oscillator 14. The output signal from the oscillator 14 may be utilized in any manner desired, such as a frequency synthesized signal. In addition, this output signal is applied to a frequency changer 15 whose output is applied to respective second inputs of the phase detector 11 and the acquisition circuit 12. Except for our combining and filter circuit 13, the phase locked loop of FIG. 1 is known in the art. This circuit causes the voltage controlled oscillator 14 to produce a selected frequency, depending upon the characteristics of the frequency changer 15. This selected frequency is relatively stable because of the stability of the reference frequency source 10.

As mentioned earlier, the acquisition circuit 12 is provided to insure that the oscillator 14 frequency of FIG. 1 can be brought within the range of operation of the phase detector 11. Once this acquisition is provided, the phase detector 11 provides the necessary signals to control the oscillator 14. Thus, there is a need to combine the signals from the phase detector 11 and the acquisition circuit 12, and to properly filter these signals to cause proper and desirable operation of the oscillator 14. A new and improved combining and filter circuit in accordance with our invention is shown in FIG. 2.

Figure 2:
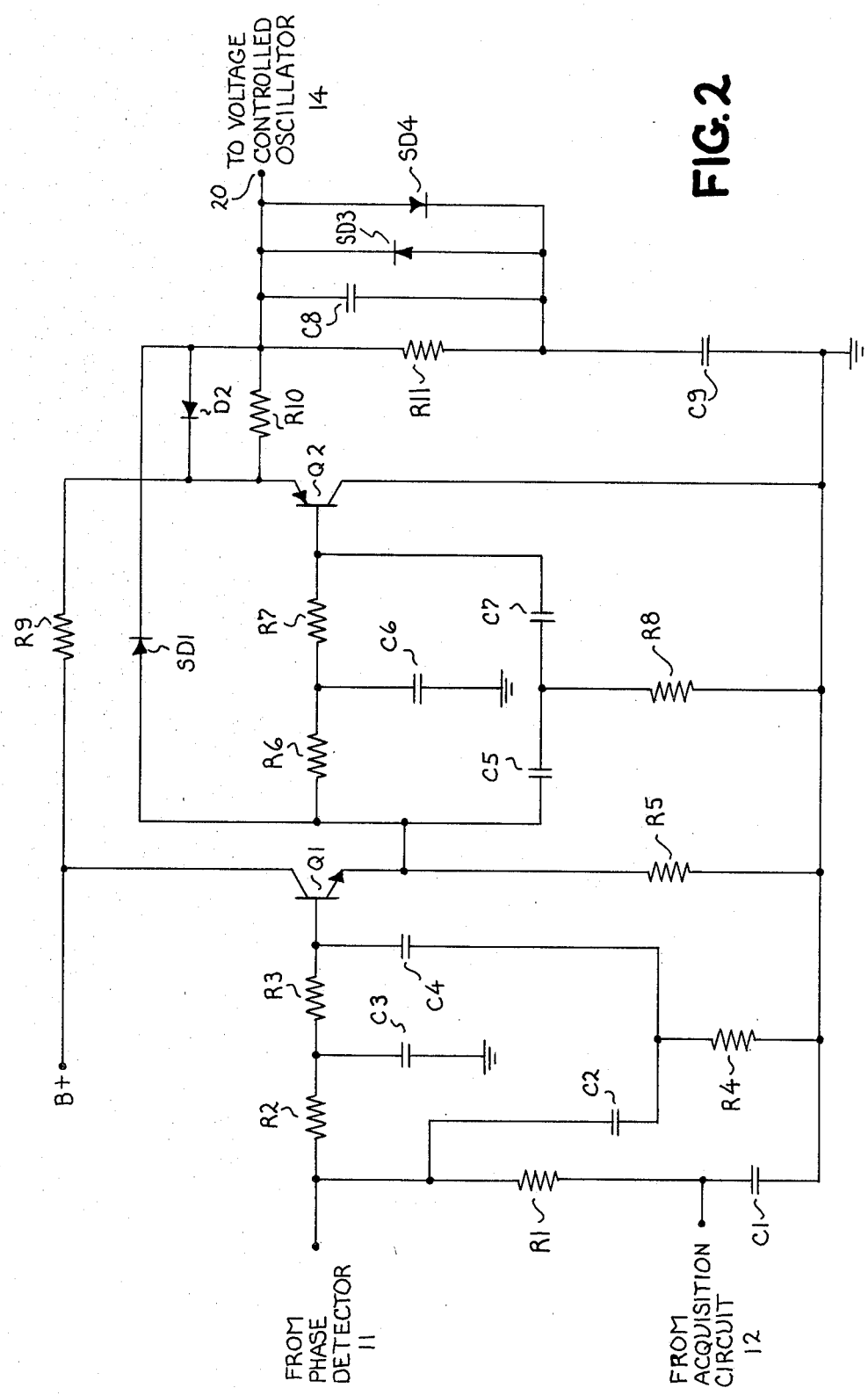
FIG. 2 shows a schematic diagram of a preferred embodiment of a combining and filter circuit in accordance with our invention for use in the phase locked loop of FIG. 1.

With reference to FIG. 2, signals from the phase detector 11 are applied through one T network filter comprised of resistors R2, R3 and a capacitor C3 to the base of an NPN transistor Q1. Signals from the acquisition circuit 12 are integrated by a circuit comprised of a resistor R1 and capacitor C1, and are applied to the base of the transistor Q1 through a second T network filter comprised of capacitors C2, C4 and a resistor R4. The two T network filters are connected as a twin-T filter which is preferably designed to filter or eliminate frequencies centered about the fundamental component of the reference frequency source 10.

The transistor Q1 is powered by a suitable direct current voltage B+ with respect to a ground or reference potential. The output from the transistor Q1 is derived at its emitter which is connected through a resistor R5 to ground. This output is applied to a second twin-T filter comprised of the resistors R6, R7 and a capacitor C6; and capacitors C5, C7 and a resistor R8. The second twin-T filter, comprised of the resistors R6, R7 and the capacitor C6; and the capacitors C5, C7 and the resistor R8, is preferably designed to filter or eliminate frequencies centered about the second harmonic component of the reference frequency source 10. The output of this second twin-T filter is applied to the base of a PNP type transistor Q2. The emitter of the transistor Q2 is connected to the voltage B+ through a resistor R9, and the collector of the transistor Q2 is connected to the ground or reference potential. The output from the transistor Q2 is provided to an output terminal 20 by a resistor R10. This resistor R10 is connected to a parallel connected capacitor C8 and resistor R11. The parallel capacitor C8 and resistor R11 are connected to a capacitor C9, which in turn is connected to ground. The resistors R10, R11 and the capacitors C8, C9 provide a filter for noise and phase correction.

In addition to the circuit described, we provide diodes connected as shown. Because of their low voltage drop in the forward direction, we prefer that certain of the diodes be the Schottky type, which are indicated by the legend SD followed by a numeral. Thus, we provide a Schottky diode SD1 poled in the forward direction from the emitter of the transistor Q1 to the output terminal 20. We provide an ordinary or silicon diode D2 poled in the forward direction from the output terminal to the emitter of the transistor Q2. Thus the diode SD1, D2 are reverse poled relative to the output terminal 20. And, we provide Schottky diodes SD3, SD4 each connected in parallel with the capacitor C8 in oppositely poled directions. The diode SD1 provides a higher charging voltage to the capacitors C8, C9, and the Schottky diodes SD3, SD4 provide reduced voltage drop paths for charging and discharging the capacitor C9.

OPERATION

The operation of the circuit of FIG. 2 will be described for an actual embodiment constructed with components and values as follows:

| | | |
|---|---|---|
| Resistor R1 | 8200 ohms | |
| Capacitor C1 | 0.047 microfarad | |
| Resistor R5 | 10000 ohms | |
| Resistor R2 | 2610 ohms | |
| Resistor R3 | 2610 ohms | This twin-T filter rejected 12.5 Kilohertz |
| Capacitor C3 | 0.01 microfarad | |
| Capacitor C2 | 0.0047 microfarad | |
| Capacitor C4 | 0.0047 microfarad | |
| Resistor R4 | 1400 ohms | |
| Resistor R6 | 2800 ohms | |
| Resistor R7 | 2800 ohms | This twin-T filter rejected 25.0 Kilohertz |
| Capacitor C6 | 0.0047 microfarad | |
| Capacitor C5 | 0.0022 microfarad | |
| Capacitor C7 | 0.0022 microfarad | |
| Resistor R8 | 1500 ohms | |
| Resistor R10 | 8871 ohms | |
| Resistor R11 | 1000 ohms | |
| Capacitor C8 | 0.47 microfarad | |
| Capacitor C9 | 4.7 microfarads | |

-continued

| | |
|---|---|
| Diodes SD1, SD3, SD4 | Type 1N5712 |
| Diode D2 | Type 1N914 |
| Transistor Q1 | Type 2N3904 |
| Transistor Q2 | Type 2N3906 |
| B+ | 8.5 volts |

With this circuit connected to the phase locked loop of FIG. 1 and in a stable condition, the voltage at the base of the transistor Q1 is the same as the voltage at the output terminal 20 which is applied to the voltage controlled oscillator 14. However, when the voltage at the base of the transistor Q1 changes to reflect a new desired condition, it is desirable that this voltage be applied to the output terminal 20 and the oscillator 14 as quickly as possible. This voltage change can come from the acquisition circuit 12, which is preferably integrated by the resistor R1 and capacitor C1. Or, the voltage change can come from the phase detector 11, or from both circuits 11, 12. The voltage change at the base of the transistor Q1 can be as follows:
1. A relatively small increase.
2. A relatively large increase.
3. A relatively small decrease.
4. A relatively large decrease.

These conditions will be described in the order listed above. In each description, we have assumed that the initial voltage at the terminal 20 which is applied to the oscillator 14 is at 5.0 volts, and that the nominal base-emitter voltage of the transistors is 0.6 volt.

For the first condition, we have assumed that the voltage at the base of the transistor Q1 increases from 5.0 to less than 5.6 volts, for example 5.2 volts. This causes the emitter of the transistor Q1 to rise from 4.4 to 4.6 volts. This is still less than the 5.0 volts at the output terminal 20, so that the Schottky diode SD1 is reverse biased. However, the base of the transistor Q2 rises to 4.6 volts, which causes its emitter to rise from 5.0 to 5.2 volts. This increase in voltage charges the capacitor C8 directly and charges the capacitor C9 through the diode SD4 to raise the output voltage to 5.2 volts.

For the second condition, we have assumed that the voltage at the base of the transistor Q1 increases a large amount, for example 6.0 volts. This causes the emitter of the transistor Q1 to rise to 5.4 volts, which forward biases the diode SD1 and applies this 5.4 volts to the capacitor C8 and the diode SD4 to rapidly charge the capacitors C8, C9 to the new voltage of 5.4 volts. Thus, this large increase utilizes the Schottky diode SD1 which rapidly charges the capacitor C9. When the voltage at the terminal 20 reaches 5.4 volts, the diode SD1 stops conducting. However, the 5.4 volts at the emitter of the transistor Q1 appears at the base of the transistor Q2, so that the emitter of the transistor Q2 is 6.0 volts. This voltage charges the capacitors C8, C9 more slowly through the resistor R10 until the voltage at the terminal 20 reaches 6.0 volts. This prevents overshooting during charging.

In the third condition, we have assumed a small decrease in the voltage at the base of the transistor Q1, for example from 5.0 to 4.8 volts. This causes the emitter to drop to 4.2 volts, so that the diode SD1 is back biased. The emitter of the transistor Q2 drops to 4.8 volts, which is not sufficient to forward bias the diode D2. Hence, the capacitor C8 discharges slowly through the resistor R10, and the capacitor C9 discharges slowly through the Schottky diode SD3 and the resistor R10.

This slowly brings the output voltage down to 4.8 volts. Thus the diode D2, which is the ordinary type diode which has a nominal voltage drop of 0.6 volt, prevents the capacitors C8, C9 from discharging too far, or overshooting.

For the fourth condition, we have assumed a large decrease in voltage at the base of the transistor Q1, for example 4.0 volts. This causes its emitter to drop to 3.4 volts, which again back biases the diode SD1. This drop causes the emitter of the transistor Q2 to drop to 4.0 volts, which forward biases the diode D2 to discharge the capacitor C8 directly, and to quickly discharge the capacitor C9 through the Schottky diode SD3 to a voltage of 4.6, after which the resistor R10 completes the discharge.

SUMMARY

It will thus be seen that we have provided a new and improved combining and filter circuit which provides improved operation in phase locked loops. While we prefer that the Schottky diodes be used in the forward direction between the transistor Q1 and the output, and across the capacitor C8 in both directions, persons skilled in the art will appreciate that ordinary diodes having a 0.6 volt drop may be used. However, the relatively low voltage drop in the forward direction provided by Schottky diode SD1 makes it preferable for charging the capacitors C8, C9, and for charging and discharging the capacitor C9 by means of the diodes SD3, SD4. Further, our arrangement provides two twin-T filters to improve operation by removing the reference frequency and its second harmonic. The transistors Q1, Q2 provide the proper input and output impedances for these filters. While we have shown only one embodiment of our invention, persons skilled in the art will appreciate that modifications may be made. As already mentioned, the use of Schottky diodes is not essential. Therefore, while we have described our invention with reference to a particular embodiment, it is to be understood that modifications may be made without departing from the spirit of the invention or from the scope of the claims.

What we claim as new and desire to secure by Letters Patent of the United States is:

1. An improved combining and filter circuit for use in a phase locked loop comprising:
   a. a first input for phase detector signals;
   b. a second input for acquisition circuit signals;
   c. first means for connecting said first and second inputs together;
   d. an output for control signals;
   e. second means including a first pair of diodes for connecting said first means to said output;
   f. a resistor and a first capacitor connected in series across said output;
   g. a second capacitor connected in parallel with said resistor;
   h. and a second pair of diodes each connected in parallel with said resistor in reverse poled directions.

2. The improved circuit of claim 1 wherein said second pair of diodes are the Schottky type.

3. The improved circuit of claim 1 or claim 2 wherein said second means include a twin-T filter.

4. The improved circuit of claim 1 or claim 2 wherein said first means include a twin-T filter.

5. The improved circuit of claim 3 wherein said first means include a twin-T filter.

6. An improved circuit for connecting a phase detector and an acquisition circuit to a voltage controlled oscillator in a phase locked loop comprising:
   a. a first input terminal for connection to said phase detector;
   b. a second input terminal of connection to said acquisition circuit;
   c. an output terminal for connection to said voltage controlled oscillator;
   d. a common terminal for said input and output terminals;
   e. filter means having inputs connected to said first and second input terminals and said common terminal, and having an output;
   f. a first resistor connected between said filter output and said output terminal;
   g. a second resistor and a first capacitor connected in series between said output terminal and said common terminal;
   h. a second capacitor connected in parallel with said second resistor;
   i. and first and second diodes each connected in parallel with said second resistor in reverse poled directions.

7. The improved circuit of claim 6 wherein said filter means comprise first and second twin-T filters.

8. The improved circuit of claim 6 or claim 7 and further comprising third and fourth diodes connected between an intermediate terminal of said filter means and said output terminal, said third and fourth diodes being poled in reverse directions relative to said output terminal.

9. The improved circuit of claim 6 or claim 7 wherein said first and second diodes are Schottky type.

10. The improved circuit of claim 8 wherein said first and second diodes are Schottky type.

11. The improved circuit of claim 6 or claim 7 wherein said second resistor is connected to said output terminal and said first capacitor is connected to said common terminal.

12. The improved circuit of claim 8 wherein said second resistor is connected to said output terminal and said first capacitor is connected to said common terminal.

13. The improved circuit of claim 9 wherein said second resistor is connected to said output terminal and said first capacitor is connected to said common terminal.

14. The improved circuit of claim 10 wherein said second resistor is connected to said output terminal and said first capacitor is connected to said common terminal.

* * * * *